United States Patent [19]

Aichelmann, Jr.

[11] Patent Number: 4,740,968

[45] Date of Patent: Apr. 26, 1988

[54] ECC CIRCUIT FAILURE DETECTOR/QUICK WORD VERIFIER

[75] Inventor: Frederick J. Aichelmann, Jr., Hopewell Junction, N.Y.

[73] Assignee: International Business Machines Corporation, Armonk, N.Y.

[21] Appl. No.: 923,522

[22] Filed: Oct. 27, 1986

[51] Int. Cl.$^4$ .............................................. G06F 11/10
[52] U.S. Cl. ............................................................ 371/3
[58] Field of Search ................................. 371/3, 37, 38

[56] References Cited

U.S. PATENT DOCUMENTS

| | | | |
|---|---|---|---|
| 3,688,265 | 8/1972 | Carter et al. | 371/38 |
| 3,891,969 | 6/1975 | Christensen | 371/3 |
| 4,107,649 | 8/1978 | Kawasaki | 371/3 |
| 4,359,771 | 11/1982 | Johnson et al. | 371/13 |
| 4,531,212 | 7/1985 | Scheuneman | 371/3 |

OTHER PUBLICATIONS

IBM J. Res. Develop., vol. 28, No. 2, Mar. 1984, pp. 177–183.
IBM J. Res. Develop., vol. 28, No. 2, Mar. 1984, pp. 124–134.

Primary Examiner—Charles E. Atkinson
Attorney, Agent, or Firm—William T. Ellis

[57] ABSTRACT

A circuit for quickly determining if all of the data bits in an ECC word are correct and/or for detecting failures in an error detection syndrome generation path in an ECC circuit, where the ECC circuit utilizes an error correction code with two diagonal quadrants in the code matrix composed entirely of columns which have an even number of ones, and with the other two quadrants composed entirely of columns which have an odd number of ones.

In one embodiment, the circuit comprises means for generating a parity bit, $P_k$, for each of K data fields in the ECC word; means for comparing logical combinations of these parity bits to logical combinations of the memory check bits, $C_j$, to form H bits; and means for logically combining these H bits to form a D bit. This D bit may be compared to the binary (non-carry) sum of the syndrome bits to detect syndrome generation path failures. This D bit may also be used to determine if the data bits in an ECC word are correct, a number of cycles before the completion of the normal ECC operation.

47 Claims, 1 Drawing Sheet

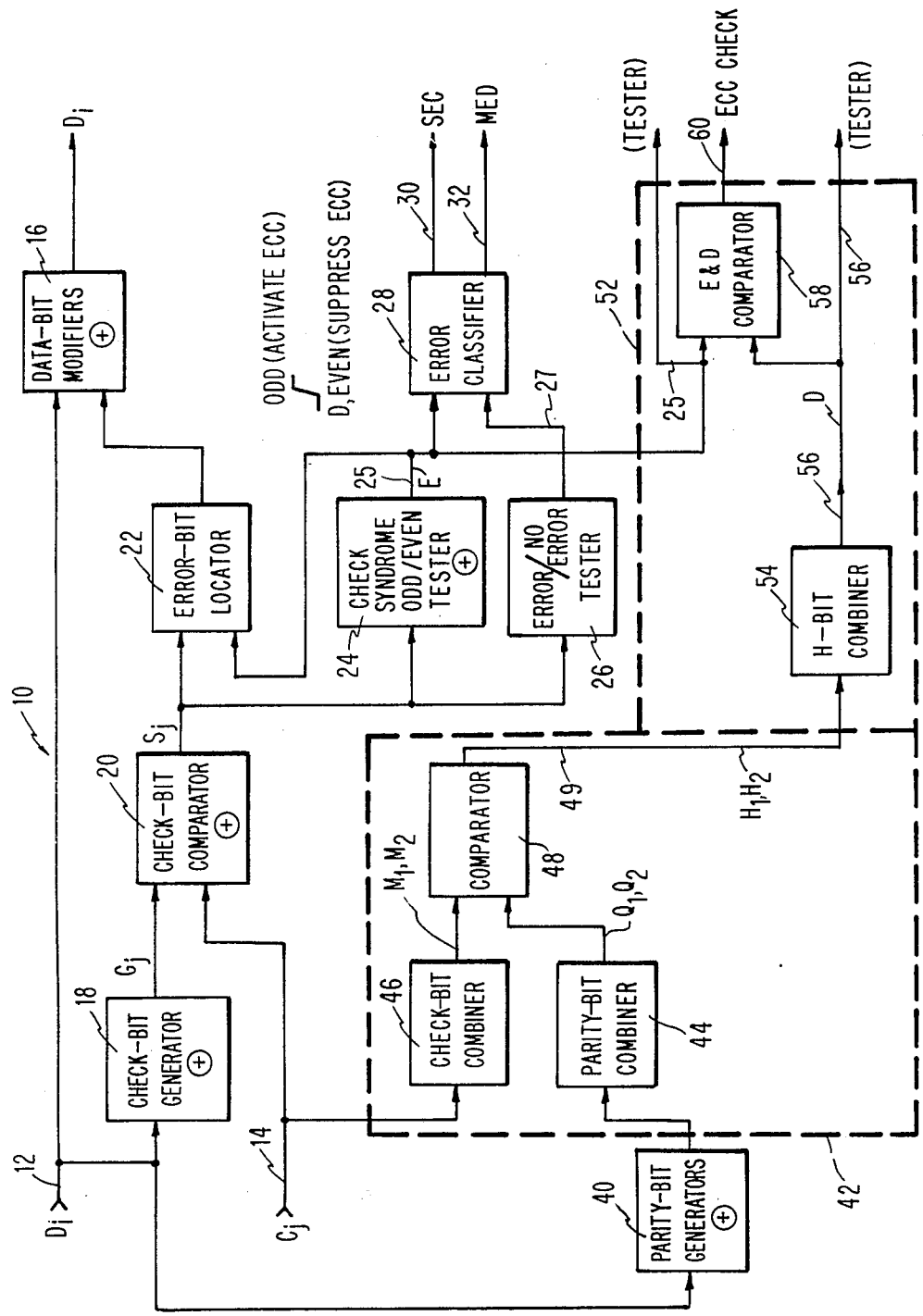

ECC CIRCUIT FAILURE DETECTOR/QUICK WORD VERIFIER

BACKGROUND OF THE INVENTION

The present invention relates generally to error checking and correction (ECC) circuits for computer memory systems, and more particularly to circuits for detecting failures in ECC circuitry.

Each new generation of computer systems substantially increases the number of high-bit-density chips utilized in the memory. This chip increase provides a corresponding increase in memory capacity. However, such large-capacity memory systems utilizing high-density memory chips are much more susceptible to memory chip failure. The most common types of chip failures include single-cell, word-line, bit-line, and chip-fail faults. In addition to these hard faults, computer chip memories are susceptible to soft errors caused by alpha-particle radiation.

However, it has long been recognized that the integrity of the data bits stored in and retrieved from such memories is critical to the accuracy of calculations performed in the data processing system. In this regard, the alteration of one bit in a data word could dramatically affect arithmetic calculations or could change the meaning of recorded data.

Accordingly, in order to minimize the consequences of hard and soft memory-errors, error checking and correction (ECC) circuits are routinely included in computer systems. These ECC circuits typically utilize an error correcting code in the class of codes known as single-error-correcting, double-error-detecting (SEC-DED) codes. Such SEC-DED codes are capable of correcting one error per data word and detecting two errors therein. Of particular advantage are the odd-weight-column error codes because of the speed, cost, and reliability of the attendant decoding logic. Examples of such codes are disclosed in FIG. 3 of Chen and Hsiao, IBM J. Res. Develop, Vol. 28, No. 2, March 1984.

The above-described ECC circuits with their error correcting codes require the storage of a predetermined number of check bits, $C_j$, along with the data bits, $D_i$, in the ECC word. For example, for 64 data bits, $D_i$, typically 8 check bits, $C_j$, are generated by means of an error-correcting-code algorithm circuit which implements an algorithm of the type disclosed in the above article. These check bits are then stored along with the word data bits. Upon readout, the data bits, $D_i$, read from an addressable memory location, are again run through an error correcting code algorithm circuit to generate a second set of check bits, $G_j$. This newly generated set of check bits is compared to the memory stored check bits, $C_j$, to obtain syndrome bits, $S_j$. If any of these syndrome bits is a one, indicating a difference in the compared check bits $G_j$ and $C_j$, then it is known that the stored data word contains an error. If it is a single error, then the syndrome bits, $S_j$, any be decoded to determine the error location in the word, and the error corrected.

However, the above-described ECC circuits for generating the syndrome bits, and the additional memory necessary to store the check bits, $C_j$, are both subject to failures. In this regard, errors can occur in the generation of the error correction code signals through circuit faults, through the erroneous recording or readback of the error correction code signals, or through read/write circuit failures. Such failures would lead to the indication of erroneous data, with the possibility of correct data being altered in the ECC circuit, when, in fact, the error occurred in the error checking and correction circuit.

The invention as claimed is intended to provide a fault detection capability for the ECC circuit, itself.

The advantage offered by the present invention is that it provides the foregoing fault detection of the ECC circuit, but without replicating, and independent of, the ECC circuit. An additional advantage is that the present invention provides this fault detection capability without the need for inserting an additional bit in the ECC word. Finally, the present circuit may be used to quickly determine if all of the data bits in an ECC word are correct a number of cycles in advance of the completion of normal ECC operations.

SUMMARY OF THE INVENTION

Briefly, the present invention comprises a circuit for detecting failures in an error detection syndrome generation path in an error checking and correction (ECC) circuit, wherein the ECC circuit includes a check bit generator for generating check bits, $G_j$, from the data in an ECC word, in accordance with an error correction code. The error correction code utilized should have a code matrix with the two and only two diagonal quadrants composed entirely of columns which have an even number of ones therein, and wherein, the other two quadrants are composed entirely of columns which have an odd number of ones therein. The ECC word in this context includes a series of data bit fields and a set of memory check bits, $C_j$. The error detection syndrome detection path generates syndrome bits, $S_j$, from a comparison of the aforementioned memory check bits, $C_j$, to the generated check bits, $G_j$. The circuit comprises:

means for generating a bit, $R_k$, for each of K data fields in the ECC word, by logically combining the data bits in the data field;

means for comparing logical combinations of the R bits, to logical combination of the memory check bits, $C_j$, to generate H bits;

means for generating a logical combination of the H bits to quickly determine if all of the data bits in the ECC word are correct and/or for comparison to logical combinations of the syndrome bits, $S_j$, to thereby independently determine whether there is a failure in the error detection syndrome generation path, but without cross-coupling with the check bit generator.

In a further embodiment of the present invention, the R bit generating means comprises means for generating a parity bit, $P_k$, for each data field in the ECC word.

In a further embodiment, this H bit generating means comprises means for combining the parity bits, $P_k$, into two logical combinations, to form bits $Q_1$ and $Q_2$; and means for combining the memory check bits, $C_j$ into two logical combinations, to form bits $M_1$, $M_2$.

In a preferred embodiment, the memory check bit combining means may comprise means for forming the bits $M_1$ and $M_2$ in accordance with the following logical combinations:

$$M_1 = C_1 \oplus C_2 \cdots \oplus C_{j/2}$$

$$M_2 = C_{j/2+1} \oplus C_{j/2+2} \cdots \oplus C_j,$$

where ⊕ is the exclusive OR function.

Likewise, in a preferred embodiment the parity bit combining means may include means for forming the bit $Q_1$ and $Q_2$ in accordance with the following logical combinations:

$$Q_1 = P_1 \oplus P_2 \ldots P_{K/2},$$

and $$Q_2 = P_{K/2+1} \oplus P_{K/2+2} \ldots \oplus P_K.$$

In a further embodiment, the H bit generating means includes means for generating bit $H_1$ from a logical combination of the bits $Q_1$ and $M_2$, and includes means for generating bit $H_2$ from a logical combination of the bits $Q_2$ and $M_1$. In a preferred embodiment, the bits $H_1$ and $H_2$ are formed in accordance with the following functions;

$$H_1 = Q_1 \oplus M_2,$$

and $$H_2 = Q_2 \oplus M_1.$$

Finally, in a preferred embodiment the circuit futher includes means for comparing the logical combination of H bits to a logical combination of syndrome bits, $S_j$, to determine whether there is a failure in the error detection syndrome generation path.

In a further embodiment of the present invention, the H and S bit comparing means includes means for logically combining the H bits to form a single bit, D, and means for logically combining the syndrome bits to form a single bit E; and means for comparing bit D to bit E to generate an ECC check bit. In a preferred embodiment, the D and E bit comparing means compares the bits in accordance with the function $$\text{ECC CHECK BIT} = D \oplus E$$

The present invention also includes the method utilized for detecting failures in an error correction syndrome generation path as described above.

BRIEF DESCRIPTION OF THE DRAWINGS

The FIGURE is a schematic block diagram of one embodiment of the present invention.

DETAILED DESCRIPTION OF THE PREFERRED EMBODIMENT

The present invention has wide applicability to error checking and correcting circuits which utilize error correction codes. However, in order to provide a detailed description of one embodiment of the present invention, the invention will be described with respect to the particular error checking and correction circuit 10 shown in the FIGURE.

Referring now to the FIGURE, ECC circuit 10 receives data bits, $D_i$, from an ECC word in a memory chip via line 12, and check bits, $C_j$, from the same ECC word via line 14. By way of example, and not by way of limitation, an ECC word with 64 data bits and 8 check bits will be used to set the context for the present invention.

The data bits, $D_i$, are applied directly to a data bit modifier 16 and to a check-bit generator 18. The data-bit modifier 16 operates to correct data in ECC words containing one and only one bit error therein. The check-bit generator 18 in combination with a check-bit comparator 20, an error-bit locator 22 and a syndrome check 24, operate to determine whether there is a single bit error, to determine its location in the data word, and to provide a signal to correct that data bit at that location in the data-modifier block 16. The check-bit generator 18, the check-bit comparator 20, the error-bit locator 22, and the check syndrome block 24 may take a variety of different circuit configurations. However, it is preferred that these blocks be designed to implement an odd-weight-column SEC-DED code of the type described by M. Y. Hsaio in the article "A Class Of Optimal Minimum Odd-Weight-Column SEC-DED Codes", IBM J. RES. Develop. 14, pages 395–401 (July 1970). In particular, it is preferred that the odd-weight-column SEC-DED code utilized have a code matrix with two and only two diagonal quadrants composed entirely of columns which have an even number of ones therein, and with the other two quadrants composed entirely of columns which have an odd number of ones therein. A typical code of this type is shown in Table 1 for a 72/64 bit ECC word.

The code matrix of Table 1 is for forming the check bits, $C_j$, which can be used to locate an erroneous data bit in an ECC word. As noted previously, these check bits are typically disposed as the last set of bits in the ECC word. Table 1 is an example of a code matrix for generating 8 check bits, $C_1$–$C_8$, for error-checking a 64-bit data word.

In the code matrix, each row represents the particular data bits from the 64 bits, $D_i$, which are to be logically combined to form the check bit designated at the far right side adjacent to that row. For example, for generating check bit, $C_1$, the matrix indicates that the following data bits, $D_i$, are to be logically combined, using, for example, five levels of exclusive OR operations:

$$C_1 = D_1 \oplus D_2 \oplus D_3 \oplus D_4 \oplus D_5 \oplus D_6 \oplus D_7 \oplus D_8 \oplus$$
$$D_{25} \oplus D_{26} \oplus D_{27} \oplus D_{28} \oplus D_{29} \oplus D_{30} \oplus D_{31} \oplus D_{32} \oplus$$
$$D_{33} \oplus D_{37} \oplus D_{38} \oplus D_{39} \oplus D_{41} \oplus D_{45} \oplus D_{46} \oplus D_{47} \oplus D_{49} \oplus$$
$$D_{53} \oplus D_{54} \oplus D_{55} \oplus D_{57} \oplus D_{61} \oplus D_{62} \oplus D_{63},$$

where + is the exclusive OR function. Such a five level exclusive OR three would require 31 exclusive OR 2-input gates.

The logical combination of each of the eight rows separately in the code in accordance with the matrix of Table 1 yields the eight check bits $C_1$–$C_8$. Accordingly, if the exclusive OR function is utilized, then 8×31 exclusive OR gates are required in the check-bit generator 18 to generate the 8 check bits.

When the check bits to be stored with the word in memory are generated from the code matrix prior to the word storage, they are referred to as memory check bits, $C_j$. When the stored word is read out and the check bits are generated again in order to be compared with the stored memory check bits, $C_j$, then they are referred to as generated check bits, $G_j$.

Continuing with the example of a 64 data bit/8 check bit ECC word, the eight generated check bits, $G_j$, are applied as one input to the check-bit comparator 20, while the eight stored memory check bits, $C_j$, are applied as a second input thereto. The check-bit comparator 20 compares each of the generated check bits, $G_j$, to its related memory check bit, $C_j$, to generate a syndrome bit, $S_j$. For example, $G_3$ is compared to $C_3$ ($G_3 \oplus C_3$) to yield the syndrome bit $S_3$. If $G_3$ and $C_3$ are the same, then there is no error in this check bit and $S_3 = 0$. If $G_3$ and $C_3$ are not the same, then this check bit is in error, and $S_3 = 1$.

Typically, this comparison function to form the eight syndrome bits may be accomplished by means of one level of exclusive OR gates, i.e., one exclusive OR gate for generating the function $S_j = C_j \oplus G_j$, for each check bit comparison.

Continuing with this 8 check bit example, the eight syndrome bits, $S_j$, resulting from the check bit comparison in the check-bit comparator 20, are applied to both the error-bit locator 22, the check syndrome block 24, and an error/no error tester block 26. The error-bit locator 22 operates to determine the bit location of any single error occurring in the 64 data bits in the ECC word. A number of circuit configurations may be utilized to accomplish this error location function. By way of example, sixty-four 8-way AND gates, one for each data bit in the ECC word, may be used to determine the bit error location in the ECC word. The eight inputs to each of the AND gates are either the true or the complement of each of the eight syndrome bits, $S_j$, as is well known in the art. If any AND gate is activated (all eight inputs are high), then it will cause a data bit, $D_i$, associated therewith to be inverted.

The check-syndrome block 24 performs the function of determining whether there is one correctable error, or zero or multiple uncorrectable errors in the sixty-four data bits in the ECC word. If there is one correctable error in the ECC word, the check syndrome block 24 generates a one output on line 25, which operates to activate the error bit locator 22, to transmit its correction information to the data-bit modifier block 16. If this line 25 output is at a zero or even level, indicating that there are either no errors or multiple uncorrectable errors in the ECC word, then the error-bit locator 22 is not activated to transmit its output. The foregoing function may be implemented simply by logically combining the syndrome bits into a single bit E. For example, this logical combination could take the form of a three level exclusive OR circuit (7 exclusive OR gates) that performs the function $$E = S_1 \oplus S_2 \oplus S_3 \oplus S_4 \oplus S_5 \oplus S_6 \oplus S_7 \oplus S_8$$

The error/no error tester block 26 performs the function of determining whether there are zero errors or one or more errors. This function can be simply implemented by means of an 8-way regular OR gate with the eight syndrome bits, $S_j$, as inputs. If there are zero errors, then the output on line 27 therefrom is zero or even. If there are one or more errors, then the output on line 27 is one or odd.

The data-bit modifier block 16 simply functions to invert any data bit, $D_i$, in the sixty-four bit data word from line 12 which the error-bit locator 22 indicates is in error. This function may be simply implemented by one level of sixty-four exclusive OR gates, one for each data bit, $D_i$. Each of these exclusive Or gates receives a designated data bit, $D_i$, at one input, and the output from the appropriate 8-way AND gate for that data bit from the error bit locator 22. If the output from the 8-way AND gate is one, then the data bit value is inverted by the exclusive OR operation. The output from the data bit modifier is applied on line 17 to a CPU.

An additional block 28, labeled as an error classified, is used to provide output signals indicating whether there are single errors (SEC), or multiple errors (MED) in the data word. The error classifier may be implemented simply by an AND gate which has to E bit on line 25 from the check-syndrome block 24 as one input, and the error/no error output on line 27 from the error/no error tester block 26 as the other input. If both inputs are one, then the output on the SEC line 30 is a "one," indicating a single error. If both inputs are even, then the MED line 32 is a "one."

The present invention is designed to detect failures in the above-described syndrome generation path. The invention performs this function by generating a bit D to be compared with the bit E from the check-syndrome block 24. If these bits are identical, then there are no failures in the ECC circuit. This D bit is generated without generating a redundant set of check bits, and without requiring an extra bit in the ECC word.

The present invention is also designed to quickly determine if the data bits in an ECC word are correct a number of cycles before the completion of the normal ECC function.

Referring again to the FIGURE, the invention comprises means 40 for generating a bit, $R_k$, from each of K data fields in the ECC word, by logically combining the data bits, $D_i$, the data field; means 42 for comparing logical combinations of the R bits, to logical combinations of the memory check bits, $C_j$, to generate H bits; in combination with means 52 for forming a logical combination of the H bits, and for comparing that logical combination to a logical combination of the syndrome bits, $S_j$, to thereby independently determine whether there is a failure in the error detection syndrome generation path, without cross-coupling with the check bit generator 18.

In a preferred embodiment of the present invention, the R bit generating means 40 comprises means for generating a parity bit, $P_k$, for each data field in the ECC word.

In a further embodiment of the present invention, the H bit generating means 42 comprises means 44 for combining the parity bits, $P_k$, from the parity-bit generator 40, into two logical combinations, to form bits $Q_1$ and $Q_2$. This H bit generating means 42 further comprises means 46 for combining the memory check bits, $C_j$, into two logical combinations, to form bits $M_1$ and $M_2$.

In one example embodiment, the parity-bit generating means 40 may comprise circuitry for generating a parity bit for each N-bit data field in accordance with the function:

$P_k = D_1 \oplus D_2 \ldots \oplus D_N$, or for data fields of eights bits, as in the present example, $P_1 = D_1 \oplus D_2 \oplus D_3 \oplus D_4 \oplus D_5 \oplus D_6 \oplus D_7 D_8$, where $+$ is the exclusive OR function. It should be noted that the term data field refers to 8-bit bytes for the example of a 72/64 bit ECC word. For an 8-bit data field, this partiy-bit generation function can be accomplished with seven exclusive OR gates formed into three levels, as is well known in the art.

The parity bit combining means 44, in one example embodiment, may include means for forming the bit $Q_1$ from a logical combination of half of the parity bits, $P_k$, and for forming the bit $Q_2$, from the logical combination of the other half of the parity bits. By way of example, for K parity bits, $P_1, P_2, \ldots P_K$, the parity bit combining means may include means for forming bit $Q_1$ from the logical combination of $P_1, \ldots P_{K/2}$, and means for forming bit $Q_2$ from the logical combination of the parity bits $P_{K/2+1} \ldots P_K$. In a preferred embodiment of the present invention, the parity bit combining means 44 includes means for forming bits $Q_1$ and $Q_2$ in accordance with the following logical combinations:

$$Q_1 = P_1 \oplus P_2 \ldots \oplus P_{K/2},$$

and $$Q_2 = P_{K/2+1} \oplus P_{K/2+2} \ldots \oplus P_K,$$

where $\oplus$ is the exclusive OR function

For the specific example, where their are eight data fields (bytes), so that K=8, than $Q_1$ and $Q_2$ would be formed in accordance with the following equations:

$$Q_1 = P_1 \oplus P_2 \oplus P_3 \oplus P_4,$$

and $$Q_2 = P_5 \oplus P_6 \oplus P_7 \oplus P_8.$$

As is well known in the art, the bit $Q_1$ can be formed by three 2-input exclusive OR gates formed in two levels. The same configuration can be used to form the bit $Q_2$.

Referring now to the memory check bit combining means 46, this block maybe formed, in one embodiment, by means for forming bit $M_1$ from a logical combination of half of the check bits, $C_j$, and for forming bit $M_2$ from a logical combination of the other half of the check bits. By way of example, for J check bits $C_1, C_2, \ldots C_J$, the memory check bit combining means 46 may include means for forming bit $M_1$ from a logical combination of the check bit $C_1 \ldots C_{J/2}$, and means for forming $M_2$ from a logical combination of $C_{J/2+1}, \ldots C_J$.

In a preferred embodiment, the memory check bit combining means 46 may comprise means for forming bits $M_1$ and $M_2$ in accordance with the following logical combinations:

$$M_1 = C_1 \oplus C_2 \ldots \oplus C_{J/2},$$

and $$M_2 = C_{J/2+1} \oplus C_{J/2+2} \ldots \oplus C_J.$$

Again, for the specific example of an ECC word with 8 check bits, the bits $M_1$ and $M_2$ *l would be formed in accordance with the following equations*

$$M_1 = C_1 \oplus C_2 \oplus C_3 \oplus C_4,$$

$$M_2 = C_5 \oplus C_6 \beta C_7 \oplus C_8.$$

The functions set forth in these equations can be realized by three exclusive OR gates formed in a two-level exclusive OR tree.

In essence, M, is the result of the binary addition of the data bits, $D_i$, in the top left and right quadrants in the code matrix of Table 1. However, in all cases where a given data bit is repeated an even number of times, it can be combined and cancelled. Accordingly, the top left quadrant in the code matrix completely cancels. However, every column in the top right quadrant of the code matrix has an odd number of ones so that every data bit $D_{33}$–$D_{64}$ is present. If the data bits $D_{33}$–$D_{64}$ are formed into parity bit combinations, then $$M_1 = D_{33} \oplus D_{34} \oplus \ldots \oplus D_{64} = P_5 \oplus P_6 \oplus P_7 \oplus P_8 = Q_2.$$

The same manipulation can be used to show that $$M_2 = D_1 \oplus D_2 \oplus D_3 \ldots \oplus D_{32} P_1 \oplus P_2 \oplus P_3 \oplus P_4 = Q_1.$$

Accordingly, the H bit generating means 42 may include means for generating bit $H_1$ from a logical combination of the bits $Q_1$ and $M_2$, and for generating bit $H_2$ from a logical combination of the bits $Q_2$ and $M_1$. In a preferred embodiment of the present invention, this H bit generating means 42 includes means 48 for generating the $H_1$ bit and the $H_2$ in accordance with the following functions:

$$H_1 = Q_1 \oplus M_2,$$

and $$H_2 = Q_2 \oplus M_1.$$

Accordingly, the $H_1$ bit may be formed by a single exclusive OR gate, and the $H_2$ bit may likewise be formed by a single exclusive OR gate. The $H_1$ and $H_2$ bit output from means 48 is provided on line 49.

The comparing means 52 operates to compare a logical combination of these $H_1$ and $H_2$ to a logical combination of the syndrome bits, $S_j$. In order to implement this function, block 54 is utilized to logically combine the H bits to form a single bit D on line 56. In one embodiment of the present invention, this block 54 may be implemented simply by a single exclusive OR gate for comparing the $H_1$ and $H_2$ bits and generating a single bit D therefrom. This single bit D is applied to a comparator 58 along with the single bit E from the check syndrome block 54. In one embodiment of the present invention, the comparator 58 may be implemented simply by a single exclusive OR gate for performing the function $D \oplus E$. If the result of this $D \oplus E$ function is zero or even, then there are no errors or failures in the error detection syndrome generation path. However, if the $D \oplus E$ function is a one or odd, than a failure has been detected in the ECC circuit. This error detecting output is applied on line 60 to other control circuitry (not shown) for either reinitializing and starting the check over again, or for performing some form of alert function.

It should be noted that the comparator 58 may be checked for errors by applying the bit D on line 56 and the bit E on line 25 directly to an external testing circuit.

It should also be noted that the circuit of the present invention can be utilized to verify that the data bits in an ECC word are correct a full two exclusive OR cycles earlier than the standard ECC circuit. This ECC word verification circuit would operate on the bit D, by itself, and would be a viable option for speeding up the transfer of errorless ECC words if ECC circuit failure checking was not a priority.

It can be seen that the present invention provides an ECC circuit facility with improved data integrity by providing a method for detecting failures within the detection syndrome generation path of the ECC circuit. This inventive circuit does not require an additional bit in the basic ECC word to provide this detection capability. Additionally, the present circuit provides this ECC circuit error detection capability without replicating the original check-bit generating circuit. In particular, for a conventional 72/64 bit ECC word, the syndrome generation circuitry would require 263 exclusive OR gates, i.e., 31×8 exclusive OR gates to generate $S_j$, and 7 exclusive OR gates to generate the syndromes. In contrast, the circuit of the present invention requires a total of only 71 exclusive OR gates, i.e., 7×8 gates for the parity generator, 3 exclusive OR gates for generating each of the bits $Q_1$, $Q_2$, $M_1$ and $M_2$, and 1 exclusive OR gate for generating each of the bits $H_1$, $H_2$, and the D bit.

By way of example, and not by way of limitation, two other error correcting codes that may be advantageously utilized to implement the present invention are shown in Table 2 and Table 3, along with the appropriate equations for $M_1$, $M_2$, $Q_1$ and $Q_2$. In Table 2, the error correcting code is for a 40/32 bit ECC word. In Table 3, the error correcting code is for an 22/16 bit ECC word.

It should be noted that the circuitry of the present invention does not use part of the results of the circuit which it is checking, and does not share circuitry therewith.

While the present invention has been particularly shown and described with reference to the preferred embodiments therefore, it will be understood by those skilled in the art that the foregoing and other changes in form and detail may be made therein without departing from the spirit and scope of the present invention.

TABLE 1

| | BYTE 1 | BYTE 2 | BYTE 3 | BYTE 4 | BYTE 5 | BYTE 6 | BYTE 7 | BYTE 8 | $C_j$ ←CHECK BIT→ | |
|---|---|---|---|---|---|---|---|---|---|---|
| $D_i$ | 12345678 | 9→16 | 17→24 | 25→32 | 33→40 | 41→48 | 49→56 | 57→64 | | |
| | 11111111 | ........ | ........ | 11111111 | 1...111. | 1...111. | 1...111. | 1...111. | 1.......$C_1$ | ↑ $M_1(Q_1)$ |
| | 11111111 | 11111111 | ........ | ........ | .1..11.1 | .1..11.1 | .1..11.1 | .1..11.1 | .1....$C_2$ | ↓ |
| | ........ | 11111111 | 11111111 | ........ | ..1.1.11 | ..1.1.11 | ..1.1.11 | ..1.1.11 | ..1....$C_3$ | |
| | ........ | ........ | 11111111 | 11111111 | ...1.111 | ...1.111 | ...1.111 | ...1.111 | ...1....$C_4$ | |
| | 1...111. | 1...111. | 1...111. | 1...111. | 11111111 | ........ | ........ | 11111111 | ....1...$C_5$ | ↑ |
| | .1..11.1 | .1..11.1 | .1..11.1 | .1..11.1 | 11111111 | 11111111 | ........ | ........ | .....1...$C_6$ | $M_2(Q_2)$ |
| | ..1.1.11 | ..1.1.11 | ..1.1.11 | ..1.1.11 | ........ | 11111111 | 11111111 | ........ | ......1.$C_7$ | ↓ |
| | ...1.111 | ...1.111 | ...1.111 | ...1.111 | ........ | ........ | 11111111 | 11111111 | .......1$C_8$ | |

PARITY CHECK MATRIX OF (72,64) CODE

TABLE 2

| | 40/32 | | | | |
|---|---|---|---|---|---|
| BYTE 1 | BYTE 2 | BYTE 3 | BYTE 4 | CHECK BITS | |
| 01234567 | 8     15 | 16     23 | 24     31 | $C_1$     $C_8$ | |
| 11111111 | | 1    111 | 1    111 | 1 | |
| 11111111 | | 1   11 1 | 1   11 1 | 1 | |
| | 11111111 | 1 1 11 | 1 1 11 | 1 | |
| | 11111111 | 1  111 | 1  111 | 1 | |
| 1    111 | 1    111 | 11111111 | | | 1 |
| 1   11 1 | 1   11 1 | 11111111 | | | 1 |
| 1 1 11 | 1 1 11 | | 11111111 | 1 | |
| 1  111 | 1  111 | | 11111111 | 1 | |

$M_1 = C_1 \oplus C_2 \oplus C_3 \oplus C_4$
$M_2 = C_5 \oplus C_6 \oplus C_7 \oplus C_8$
$Q_1 = P_1 \oplus P_2 = M_2$
$Q_2 = P_3 \oplus P_4 = M_1$

TABLE 3

| | 22/16 | |
|---|---|---|
| BYTE 1 | BYTE 2 | CHECK BITS |
| 01234567 | 8     15 | $C_1$     $C_6$ |
| 11111 | 1 1 1 | 1 |
| 11111 | 1 1 1 | 1 |
| 111   111 | 1 1 | 1 |
| 1   1   1 | 11111 | 1 |

TABLE 3-continued

| | 22/16 | |
|---|---|---|
| BYTE 1 | BYTE 2 | CHECK BITS |
| 1  1  1 | 11111 | 1 |
| 1     1 | 111   111 | 1 |

$M_1 = C_1 \oplus C_2 \oplus C_3$
$M_2 = C_4 \oplus C_5 \oplus C_6$
$Q_2 = P_2 = M_1$
$Q_1 = P_1 = M_2$

I claim:

1. A circuit for quickly determining if all of the data bits in an ECC word are correct and/or for detecting failure in an error detection syndrome generation path in an error checking and correction (ECC) circuit, wherein said ECC circuit includes a check bit generator for generating check bits, $G_j$, from the data bits in an ECC word, in accordance with an error correction code, wherein said ECC word includes a series of data bit fields and a set of memory check bits, $C_j$, and wherein said error detection syndrome generation path generates syndrome bits, $S_j$, from a comparison of said memory check bits, $C_j$, to said generated check lists, $G_j$, comprising:

means for generating a bit, $R_k$, for each of K data fields in the ECC word, by logically combining the data bits in said data field;

means for comparing logical combinations of said R bits, to logical combinations of said memory check bits, $C_j$, to generate H bits; and means for generating a logical combination of said H bits to quickly determine if all of the data bits in said ECC word are correct and/or for comparison to logical combinations of said syndrome bits to thereby independently determine whether there is a failure in said end detection syndrome generation path, but without cross-coupling with said check bit generator.

2. A circuit as defined in claim 1, wherein two and only two diagonal quadrants of said code matrix each are composed entirely of columns which have an even number of ones, and the other two diagonal quadrants are composed entirely of columns which have an odd number of ones.

3. A circuit as defined in claim 2, wherein said R bit generating means comprises means for generating a parity bit, $P_k$, for each data field in said ECC word.

4. A circuit as defined in claim 3, wherein said H bit generating means comprises:

means for combining said parity bits, $P_k$, into logical combinations, to forms bits $Q_1$ and $Q_2$; and means for combining said memory check bits, $C_j$, into two logical combination, to form bits $M_1$ and $M_2$.

5. A circuit as defined in claim 4, wherein said memory check bit combining means includes means for forming bit $M_1$ from a logical combination of half of said check bits, $C_j$, and for forming bit $M_2$ from a logical combination of the other half of said check bits, $C_j$.

6. A circuit as defined in claim 5, wherein, for J check bits $C_1, C_2, \ldots C_J$, said memory check bit combining means include means for forming bit $M_1$ from a logical combination of $C_1 \ldots C_{J/2}$, and means for forming bit $M_2$ from a logical combination of $C_{J/2+1} \ldots C_J$.

7. A circuit as defined in claim 6, wherein said memory check bit combining means includes means for forming bits $M_1$, and $M_2$ in accordance with the following logical combinations:

$$M_1 = C_1 \oplus C_2 \ldots \oplus C_{J/2},$$

and $$M_2 = C_{J/2+1} \oplus C_{J/2+2} \ldots \oplus C_J,$$

where $\oplus$ is the exclusive OR function.

8. A circuit as defined in claim 7, wherein said parity bit combining means include means for forming bits $Q_1$ and $Q_2$ in accordance with the following logical combinations:

$$Q_1 = P_1 \oplus P_2 \ldots \oplus P_{K/2},$$

and $$Q_2 = P_{K/2+1} \oplus P_{K/2+2} \ldots \oplus P_K,$$

where $\oplus$ is the exclusive OR function.

9. A circuit as defined in claim 8, wherein said H bit generating means includes means for generating bit $H_1$ from a logical combination of the bits $Q_1$ and $M_2$, and for generating bit $H_2$ from a logical combination of the bits $Q_2$ and $M_1$.

10. A circuit as defined in claim 12, wherein said H bit generating means includes means for generating the $H_1$ bit and the $H_2$ bit in accordance with the following functions:

$$H_1 = Q_1 \oplus M_2,$$

and $$H_2 = Q_2 \oplus M_1,$$

where $\oplus$ is the exclusive OR functions.

11. A circuit as defined in claim 4, wherein said parity bit combining means includes means for forming bit $Q_1$ from a logical combination of half of said parity bits, $P_k$, and means for forming bit $Q_2$ from a logical combination of the other half of said parity bits, $P_k$.

12. A circuit as defined in claim 11, wherein, for K parity bits $P_1, P_2, \ldots P_K$, said parity bit combining means includes means for forming bit $Q_1$ from the logical combination of $P_1, \ldots P_{K/2}$, and means for forming bit $Q_2$ from the logical combination of $P_{K/2+1} \ldots P_K$.

13. A circuit as defined in claim 12, wherein said parity bit combining means include means for forming bits $Q_1$ and $Q_2$ in accordance with the following logical combinations:

$$Q_1 = P_1 \oplus P_2 \ldots \oplus P_{K/2},$$

and $$Q_2 = P_{K/2+1} \oplus P_{K/2+2} \ldots \oplus P_K,$$

where $\oplus$ is the exclusive OR function.

14. A circuit as defined in claim 2, further comprising means for comparing said logical combination of said H bits to a logical combination of said syndrome bits, $S_j$, to determine whether there is a failure in said error detection syndrome generator path.

15. A circuit as defined in claim 14, wherein said H and S bit comparing means includes means for logically combining said H bits to form a single bit D.

16. A circuit as defined in claim 15, wherein said H and S bit comparing means includes:
means for logically combining said syndrome bits to form a single bit, E, and
means for comparing bit D to bit E to generate an ECC check bit.

17. A circuit as defined in claim 16, wherein said D and E bit comparing means compares said bits in accordance with the function ECC CHECK BIT $= D \oplus E$, where $\oplus$ is the exclusive OR function.

18. A circuit as defined in claim 14, wherein said parity bit generating means includes means for generating a parity bit in accordance with the function $$P_k = D_1 \oplus D_2 \ldots \oplus D_N$$

for each data field, wherein there are N data bits in each data field and wherein $\oplus$ is the exclusive OR function.

19. A circuit as defined in claim 14, wherein said R bit generating means comprises means for generating a parity bit, $P_k$, for each data field in said ECC word.

20. A circuit as defined in claim 19, wherein said H bit generating means comprises:
means for combining said parity bits, $P_k$, into two logical combinations, to form bits $Q_1$ and $Q_2$; and
means for combining said memory check bits, $C_j$, into two logical combinations to form bits $M_1$ and $M_2$.

21. A circuit as defined in claim 20, wherein said memory check bit combining means includes means for forming bit $M_1$ from a logical combination of half of said check bits, $C_j$, and for forming bit $M_2$ from a logical combination of the other half of said check bits, $C_j$.

22. A circuit as defined in claim 21, wherein said parity bit combining means includes means for forming bit $Q_1$ from a logical combination of half of said parity bits, $P_k$, and means for forming bit $Q_2$ from a logical combination of the other half of said parity bits.

23. A circuit as defined in claim 21, wherein, for J check bits $C_1, C_2, \ldots C_J$, said memory check bit combining means includes means for forming bits $M_1$ and $M_2$ in accordance with the following logical combinations:

$$M_1 = C_1 \oplus C_2 \ldots \oplus C_{J/2},$$

and $$M_2 = C_{J/2+1} \oplus C_{J/2+2} \ldots \oplus C_J,$$

where $\oplus$ is the exclusive OR function.

24. A circuit as defined in claim 23, wherein, for K parity bits $P_1, P_2, \ldots P_K$, said parity bit combining means includes means for forming bit $Q_1$ from the logical combination of $P_1, \ldots P_{K/2}$, and means for forming bit $Q_2$ from the logical combination of $P_{K/2+1} \ldots P_K$.

25. A circuit as defined in claim 23, wherein said parity bit combining means includes means for forming bits $Q_1$ and $Q_2$ in accordance with the following logical combinations:

$$Q_1 = P_1 \oplus P_2 \ldots \oplus P_{K/2},$$

and $$Q_2 = P_{K/2+1} \oplus P_{K/2+2} \ldots \oplus P_K,$$

where $\oplus$ is the exclusive OR function.

26. A circuit as defined in claim 25, wherein said H bit generating means includes means for generating bit $H_1$ from a logical combination of $Q_1$ and $M_2$, and for generating $H_2$ from a logical combination of $Q_2$ and $M_1$.

27. A circuit as defined in claim 26, wherein said H bit generating means includes means for generating the $H_1$ bit and the $H_2$ bit in accordance with the following functions:

$$H_1 = Q_1 \oplus M_2,$$

and $$H_2 = Q_2 \oplus M_1,$$

where $\oplus$ is the exclusive OR function.

28. A circuit as defined in claim 27, wherein said H and S bit comparing means includes means for logically combining said H bits to form a single bit D.

29. A circuit as defined in claim 28 wherein said H and S bit comparing means includes:
means for logically combining said syndrome bits to form a single bit E, and means for comparing bit D to bit E to generate an ECC check bit.

30. A circuit as defined in claim 29, wherein said D and E comparing means compares said bits in accordance with the function $$\text{ECC CHECK} = D \oplus E,$$

where $\oplus$ is the exclusive OR function.

31. A method for quickly determining if all of the data bits in an ECC word are correct and/or for detecting failures in an error correction syndrome generation path in an error checking and correction (ECC) circuit, wherein said ECC circuit includes a check bit generator for generating check bits, $G_j$, from the data in an ECC word, in accordance with an error correction code, wherein said ECC word includes a series of data bit fields and a set of memory check bits, $C_j$, and wherein said error detection syndrome generation path generates syndrome bits, $S_j$, from a comparison of said memory check bits, $C_j$, to said generated check bits, $G_j$, comprising the steps of:
generating a bit, $R_k$, for each of K data fields in said ECC word by logically combining data bits in said data field;
comparing logical combinations of said $R_k$ bits, to logical combinations of said memory check bits, $C_j$, to generate H bits; and
generating a logical combination of said H bits to quickly determine if all of the data bits in said ECC word are correct and/or to independently determine whether there is a failure in said error detection syndrome generation path, without cross-coupling with said check bit generator.

32. A method as defined in claim 31, wherein said parity bit combining step includes the step of forming said bits $Q_1$ and $Q_2$ in accordance with the following logical conditions:

$$Q_1 = P_1 \oplus P_2 \ldots \oplus P_{K/2},$$

and $$Q_2 = P_{K/2+1} \oplus P_{K/2+2} \ldots \oplus P_K,$$

where $\oplus$ is the exclusive OR function.

33. A method as defined in claim 31, wherein two and only two diagonal quadrants of said code matrix are each composed entirely of columns which have an even number of ones, and the other two diagonal quadrants are composed entirely of columns having an odd number of ones.

34. A method as defined in claim 33, wherein said $R_k$ bit generating step comprises the step of generating a parity bit, $P_k$, for each of said K data fields in said ECC word.

35. A method as defined in claim 34, wherein said H bit generating step comprises the steps of combining said parity bits, $P_k$, into two separate logical combinations to form bits $Q_1$ and $Q_2$, and combining said memory check bits, $C_j$, into two separate logical combinations to form the bits $M_1$ and $M_2$.

36. A method as defined in claim 35, wherein said parity bit generating step includes the step of generating a parity bit in accordance with the function $$P_k = D_1 \oplus D_2 \ldots \oplus D_N,$$

for each bit data field, where there are N data bits in each data field and wherein $\oplus$ is the exclusive OR function.

37. A method as defined in claim 35, wherein said H bit generating step includes the step of generating the $H_1$ bit and the $H_2$ bit in accordance with the following functions:

$$H_1 = Q_1 \oplus M_2,$$

and $$H_2 = Q_2 \oplus M_1,$$

where $\oplus$ is the exclusive OR function.

38. A method as defined in claim 37, further comprising the step of comparing said logical combination of said H bits to a logical combination of said syndrome bits, $S_j$, to determine whether there is a failure in said error detection syndrome generation path.

39. A method as defined in claim 38, wherein said H and S bit comparing step includes the step of logically combining said H bits to form a single bit D, and logically combining said syndrome bits, $S_j$, to form a single bit E; and comparing bit D to bit E to generate an ECC check bit.

40. A method as defined in claim 39, wherein said D and E bit comparing means compares said bits in accordance with the function:

$$\text{ECC CHECK BIT} = D \oplus E,$$

where $\oplus$ is the exclusive OR function.

41. A method as defined in claim 35, wherein for J check bits $C_1, C_2, \ldots C_J$, said check bit combining step comprises the step of forming bit $M_1$ from a logical combination of $C_1 \ldots C_{J/2}$, and forming bit $M_2$ from a logical combination of $C_{J/2+1} \ldots C_J$.

42. A method as defined in claim 41, wherein said check bit combining step comprises the step of forming bits $M_1$ and $M_2$ in accordance with the following logical combinations:

$$M_1 = C_1 \oplus C_2 \ldots \oplus C_{J/2},$$

and $$M_2 = C_{J/2+1} \oplus C_{J/2+2} \ldots \oplus C_J,$$

where + is the exclusive OR function.

43. A method as defined in claim 41, wherein for K parity bits $P_1, P_2, \ldots P_K$, said parity bit combining step comprises the step of forming bit $Q_1$, from the logical combination of $P_1, \ldots P_{K/2}$, and forming bit $Q_2$ from the logical combination of $P_{K/2+1} \ldots P_K$.

44. A method as defined in claim 43, wherein said parity bit combining step includes the step of forming said bits $Q_1$ and $Q_2$ in accordance with the following logical combinations:

$$Q_1 = P_1 \oplus P_2 \ldots \oplus P_{K/2},$$

and $$Q_2 = P_{K/2+1} \oplus P_{K/2+2} \ldots \oplus P_K,$$

where $\oplus$ is the exclusive OR function.

45. A method as defined in claim 43, wherein said H bit generating step includes the step of generating a bit $H_1$ from a logical combination of bits $Q_1$ and $M_2$, and generating a bit $H_2$ from a logical combination of bits $Q_2$ and $M_1$.

46. A method as defined in claim 45, wherein said H bit generating step includes the step of generating the $H_1$ bit and the $H_2$ bit in accordance with the following functions:

$$H_1 = Q_1 \oplus M_2,$$

and $$H_2 = Q_2 \oplus M_1,$$

where $\oplus$ is the exclusive OR function.

47. A circuit for detecting failures in an error detection syndrome generation path of an error checking and correcting (ECC) circuit which ECC circuit uses an error correcting code having two diagonal quadrants in the code matrix composed entirely of columns which have an even number of ones, and with the other two quadrants composed entirely of columns which have an odd number of ones, wherein said ECC circuit includes a check bit generator for generating check bits, $G_j$, from the data bits in an ECC word in accordance with said error correcting code, wherein said ECC word includes a series of data bit fields and a set of memory check bits, $C_j$, and wherein said error detection syndrome generation path generates syndrome bits, $S_j$, from a comparison of said memory check bits, $C_j$, to said generated check bits, $G_j$, comprising:

means for generating parity bits $P_1, P_2, \ldots P_K$, one for each of K data fields in said ECC word;

means for logically combining said parity bits, $P_k$, to form bits $Q_1$ and $Q_2$, in accordance with the logical combinations:

$$Q_1 = P_1 \oplus P_2 \ldots \oplus P_{K/2},$$

and $$Q_2 = P_{K/2+1} \oplus P_{K/2+2} \ldots \oplus P_k,$$

where $\oplus$ is the exclusive OR function;

means for logically combining said check bits, $C_j$, to form bits $M_1$ and $M_2$, in accordance with the logical combinations:

$$M_1 = C_1 \oplus C_2 \ldots \oplus C_{J/2},$$

and $$M_2 = C_{J/2+1} \oplus C_{J/2+2} \ldots \oplus C_J,$$

where there are J check bits;

means for logically combining said Q and M bits to form the bits $H_1$ and $H_2$ in accordance with the following logical combinations:

$$H_1 = Q_1 \oplus M_2,$$

and $$H_2 = Q_2 \oplus M_1;$$

means for generating the function $D = H_1 \oplus H_2$;

means for adding said syndrome bits, $S_j$, to form a single bit E; and means for generating an ECC CHECK BIT with the function ECC CHECK BIT $= D \oplus E$, wherein said ECC CHECK BIT independently indicates whether there is a failure in said error detection syndrome generation path without cross-coupling with said check bit generator.

* * * * *

UNITED STATES PATENT AND TRADEMARK OFFICE
CERTIFICATE OF CORRECTION

PATENT NO. : 4,740,968
DATED : April 26, 1988
INVENTOR(S) : Frederick J. Aichelmann, Jr.

It is certified that error appears in the above-identified patent and that said Letters Patent is hereby corrected as shown below:

Column 7, line 57, the equation should read as follows:

$$M_2 = C_5 \oplus C_6 \oplus C_7 \oplus C_8$$

Column 9, Table 2, the first four rows of "1"s under BYTE 4 should read as follows:

BYTE 4

| 24 | 25 | 26 | 27 | 28 | 29 | 30 | 31 |
|----|----|----|----|----|----|----|----|
| 1  |    |    |    | 1  | 1  | 1  |    |
|    | 1  |    |    |    | 1  | 1  | 1  |
|    |    | 1  |    |    | 1  |    | 1  |
|    |    |    | 1  |    |    | 1  | 1  |

Column 9, Table 3, the first four rows of "1"s under BYTE 2 should read as follows:

BYTE 1

| 0 | 1 | 2 | 3 | 4 | 5 | 6 | 7 |
|---|---|---|---|---|---|---|---|
| 1 | 1 | 1 | 1 | 1 |   |   |   |
|   |   |   | 1 | 1 | 1 | 1 | 1 |
| 1 | 1 | 1 |   |   | 1 | 1 | 1 |
| 1 |   |   | 1 |   |   | 1 |   |

BYTE 2

| 8 | 9 | 10 | 11 | 12 | 13 | 14 | 15 |
|---|---|----|----|----|----|----|----|
| 1 |   |    | 1  |    |    | 1  |    |
|   | 1 |    |    | 1  |    |    | 1  |
|   |   | 1  |    |    | 1  |    |    |
| 1 | 1 | 1  | 1  | 1  |    |    |    |

UNITED STATES PATENT AND TRADEMARK OFFICE
CERTIFICATE OF CORRECTION

PATENT NO. : 4,740,968

DATED : April 26, 1988

INVENTOR(S) : Frederick J. Aichelmann, Jr.

It is certified that error appears in the above-identified patent and that said Letters Patent is hereby corrected as shown below:

Claim 10, line 38, change the dependency from "claim 12" to --claim 9--.

Signed and Sealed this

Thirty-first Day of January, 1989

Attest:

DONALD J. QUIGG

*Attesting Officer*     *Commissioner of Patents and Trademarks*